United States Patent [19]

Van Heelsbergen

[11] Patent Number: 4,810,968

[45] Date of Patent: Mar. 7, 1989

[54] MAGNETIC RESONANCE IMAGING APPARATUS COMPRISING A PIN DIODE UNCOUPLED DETECTION COIL

[75] Inventor: Teunis R. Van Heelsbergen, Eindhoven, Netherlands

[73] Assignee: U.S. Philips Corp., New York, N.Y.

[21] Appl. No.: 58,419

[22] Filed: Jun. 5, 1987

[30] Foreign Application Priority Data

Dec. 22, 1986 [NL] Netherlands .................. 8603250

[51] Int. Cl.$^4$ .................................. G01R 33/22
[52] U.S. Cl. .................................. 324/322
[58] Field of Search .................... 324/322, 318

[56] References Cited

U.S. PATENT DOCUMENTS

| 4,052,661 | 10/1977 | Higham et al. | 324/322 |
| 4,093,911 | 6/1978 | Hill et al. | 324/322 |
| 4,620,155 | 10/1986 | Edelstein | 324/318 |
| 4,638,252 | 1/1987 | Bradshaw | 324/300 |
| 4,649,348 | 3/1987 | Flugan | 324/322 |
| 4,684,895 | 8/1987 | Misic | 324/322 |

OTHER PUBLICATIONS

Engle, J. L., "Broadband Transmit/Receive Circuit for NMR", Rev. Sci. Instrum., 49(g) (Sep. 1978) pp. 1356–1357.
Moores, M. B. et al., "VHF Pulsed Magnetic Resonance Duplexers", Rev. Sci. Instrum, 42(g) (Sep. 1971) pp. 1329–1333.
Kan, S., et al., "A Versatile and Inexpensive Electronic System for a High Resolution NMR Spectrometer", Rev. Sci. Instrum, 44(12) (Dec. 1973) pp. 1725–1733.
Kisman, K. E. et al., "Coupling Scheme and Probe Damper for Pulsed Nuclear Magnetic Resonance Single Coil Probe", Rev. Sci. Inst., 45(g) (Sep. 1974) pp. 1159–1163.

Primary Examiner—Stewart J. Levy
Assistant Examiner—Lawrence G. Fess
Attorney, Agent, or Firm—Bernard Franzblau

[57] ABSTRACT

In a magnetic resonance imaging apparatus comprising a surface coil, the circuit in which the surface coil is included is interrupted by means of a PIN diode in the non-active state of the coil. In addition to the PIN diode in the resonant circuit of the surface coil, PIN diodes are included in all supply leads of the resonant circuit. An advantage thereof consists in that no RF currents will flow in the supply leads and that the induction voltages generated in the surface coil in the active state of the transmitter coil of the device are actually rectified by the diodes and themselves form a blocking voltage for the PIN diodes included in the circuit. As a result, the biasing of the PIN diodes is increased, so that they remain blocked.

10 Claims, 2 Drawing Sheets

MAGNETIC RESONANCE IMAGING APPARATUS COMPRISING A PIN DIODE UNCOUPLED DETECTION COIL

BACKGROUND OF THE INVENTION

This invention relates to a magnetic resonance imaging apparatus, comprising a magnet system for generating a steady, uniform main magnetic field and gradient magnetic fields, a transmitter coil for generating a local, uniform RF magnetic alternating field in an examination space, a detection coil for detecting spin resonance signals generated in an object to be examined, and a processing device for processing the detected resonance signals.

A magnetic resonance imaging apparatus of this kind is known from Netherlands patent application No. 8401671, which corresponds to U.S. Application Ser. No. 031,064 (Mar. 26, 1987). Said Netherlands patent application mentions that the transmitter coil is uncoupled from the receiver coil during detection of the spin resonance signals and vice versa. Although the described uncoupling by means of semiconductor diodes is in principle correct, the uncoupling circuits given are not perfect and can be improved.

SUMMARY OF THE INVENTION

It is an object of the invention to provide a magnetic resonance imaging apparatus which comprises an electronic uncoupling circuit for the detection coil and in which uncoupling is perfected. To achieve this, a magnetic resonance imaging apparatus in accordance with the invention is characterized in that the uncoupling circuit comprises PIN diodes, at least one of which is connected in series within the resonant circuit which includes the detection coil, and at least a second of which is connected in series with a connection lead which carries the signal detected by the detection coil to the processing device. In a magnetic resonance imaging apparatus comprising such an electronic uncoupling circuit, it is ensured that the resonant circuit is interrupted so that it is no longer tuned to the operating frequency of the transmitter coil, and also that the connection lead which connects the detection coil to the processing device is interrupted so that no RF current can flow therein.

BRIEF DESCRIPTION OF THE DRAWINGS

The invention will be described in detail hereinafter with reference to the accompanying diagrammatic drawing, in which.

DESCRIPTION OF THE PREFERRED EMBODIMENTS

Figure 1:
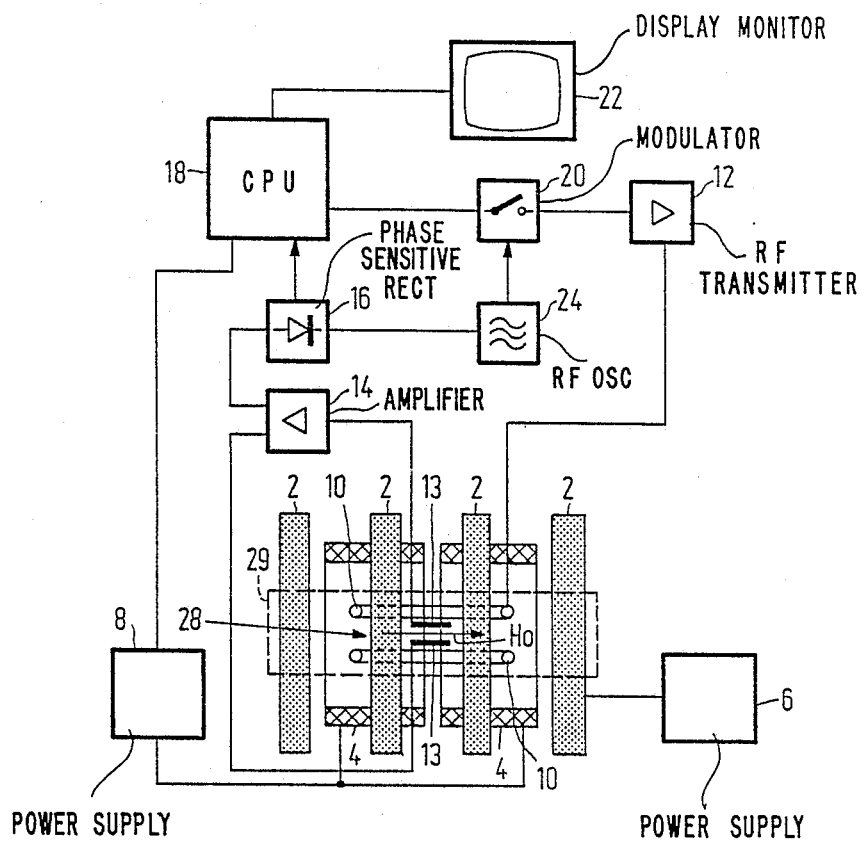
FIG. 1 shows a magnetic resonance imaging apparatus in accordance with the invention.

A magnetic resonance imaging apparatus as shown in FIG. 1 comprises a magnet system 2 for generating a steady magnetic field H0, a magnet system 4 for generating magnetic gradient fields, and power supply sources 6 and 8 for the magnet system 2 and the magnet system 4, respectively. An RF coil 10 serves to generate an RF magnetic alternating field. To this end, it is connected to the RF source 12. For detection of the resonance signal generated by the RF transmitter field in an object to be examined, use is made of an RF coil 13. To this end this coil is connected to a signal amplifier 14. The signal amplifier 14 is connected to a phase-sensitive rectifier 16 which is connected to a central processor unit 18. The central processor unit 18 also controls a modulator 20 for the RF source 12, the supply source 8 for the gradient magnetic coils and a monitor 22 for display. An RF oscillator 24 controls the modulator as well as the phase-sensitive rectifier 16 processing the measurement signals. The transmitter coil 10 which is arranged within the magnet systems 2 and 4 encloses a measurement space 28 which, in the case of a medical diagnostic apparatus, is large enough to accommodate a patient to be examined. Thus, in the measurement space 28 a steady magnetic field H0, gradient magnetic fields for selecting object slices, and a spatially RF alternating field are to be generated. After having generated an RF magnetic field, the RF coil 10 must be deactivated quickly because the resonance signal subsequently generated must be detected for example by means of the detection coil 13. The RF coil 10 must be deactivated so as not to disturb the detection of the resonance signals by the surface coil 13. Similarly, it is undesirable for the surface coil 13 to be still switched on when the RF transmitter coil 10 is switched on. To this end, there are provided electronic means which deactivate the surface coil 13. As described in said Netherlands patent application, this is achieved by including a semiconductor diode switch in the resonant circuit comprising the detection coil 13. This switch interrupts the resonant circuit when the transmitter coil 10 is to be activated. It has been found that the inclusion of such a semiconductor switch in the series circuit alone is insufficient for adequate suppression of an RF field to be generated by the transmitter coil 10.

Figure 2:
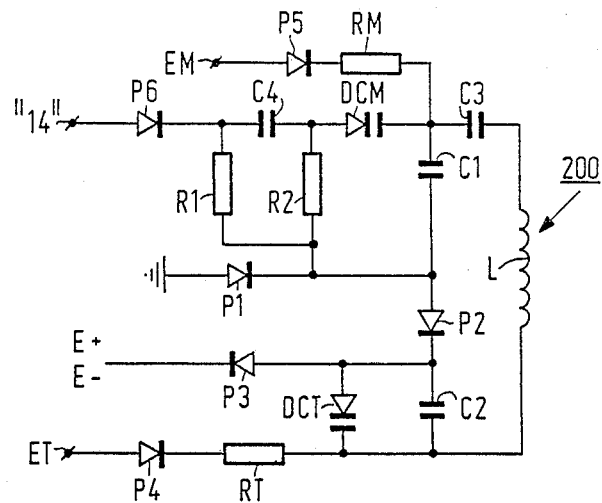
FIG. 2 shows an electronic uncoupling circuit having a detection coil for the device in accordance with the invention.

FIG. 2 shows an embodiment of an electronic uncoupling circuit 200 in which the described drawback is mitigated. The electronic uncoupling circuit 200 shown in FIG. 2 comprises a detection coil L which is included in a resonant circuit which also includes three capacitors C1, C2 and C3. The capacitor C2 is connected parallel to a tuning capacitor DCT for tuning the resonant circuit to the desired resonance frequency. The circuit also includes a PIN diode P2 which is used for interrupting the circuit when the transmitter coil 10 (FIG. 1) is to be activated. The anode of the PIN diode P2 is connected via a PIN diode P1 to ground, while the cathode of the PIN diode P2 is connected to a supply source E+ or E- via a third PIN diode P3. The supply sources E- and E+ supply a negative voltage and a positive voltage, respectively. In the former case, the diodes P1, P2 and P3 are conductive so that the detection coil L and the capacitors C1, C2 and C3 can be active in the resonant circuit. When a positive voltage (E+) is applied to the diode P3, the diodes P1 to P3 are blocked and the resonant circuit is interrupted. There is also provided a PIN diode P4 via which a tuning voltage is applied to the cathode of the tuning capacitor DCT, via a resistor RT. The tuning capacitor DCT is formed by a varicap diode. Therefore, the PIN diode P4 is included to isolate the supply source ET, controlling the varicap DCT, from the RF section when the detection circuit is deactivated by application of a positive voltage E+ to the PIN diode P3. In order to match the resonant circuit (L, C1, C2, C3, DCT) to the impedance of the detector 14 (FIG. 1), connected to the resonant circuit, there is provided a matching capacitor (varicap) DCM which is connected in series with a capacitor C4. The desired matching is obtained by tuning the capacitance by application of a control voltage EM, via a PIN diode P5 and the resistor RM, to the cathode of the varicap DCM. The PIN diode P5 also is provided to shield the supply source EM for matching the impedance of the resonant circuit from RF signals as soon as the detection coil is deactivated. Similarly, the lead connecting the resonant circuit to the detector 14 (FIG. 1) also includes a PIN diode P6. The resistor R1 which connects the cathode of the diode P1 to the cathode of the PIN diode P6 and to the capacitor C4 ensures that a current flows through the PIN diode P6 in the active state of the resonant circuit in which the PIN diode P1 is conductive, so that the diode P6 does not form an obstruction for the signals received by the detection coil L. The resistor R2 serves to supply a reference voltage for the anode of the varicap DCM. It will be apparent that the PIN diode P6 in the supply lead for the resonant circuit in FIG. 2 ensures that, when the resonant circuit is deactivated, no further current can flow in the supply lead to the detector 14. Furthermore, the diodes P4 and P5 ensure that no RF current can flow in the supply leads for the tuning capacitor DCT and the matching capacitor DCM.

Figure 3:
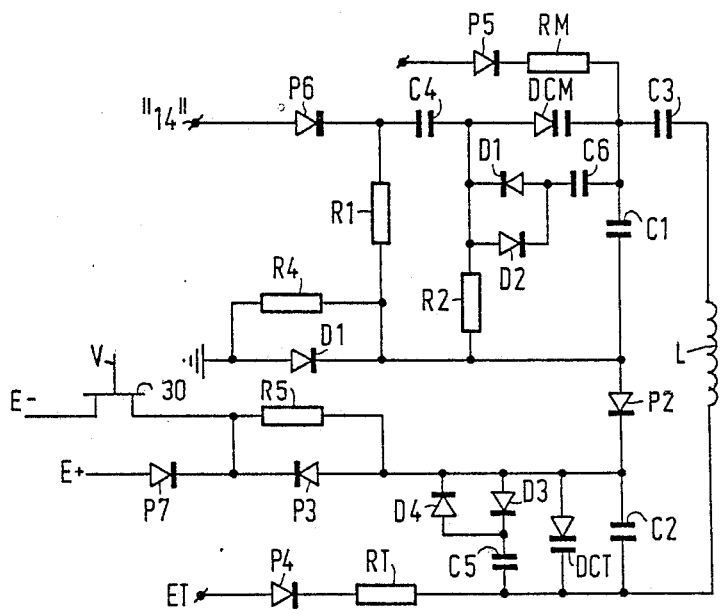
FIG. 3 shows a preferred embodiment of an electronic uncoupling circuit.

FIG. 3 shows a preferred embodiment of a detection circuit in accordance with the invention. The components in FIG. 3 which correspond to components shown in FIG. 2 are denoted by the same reference numerals. Each of the varicap diodes DCT and DCM is connected parallel to two parallel-connected diodes D3 and D4 or D1 and D2, which themselves are connected in series with a capacitor C5, C6, respectively. The diodes D1 and D2 or D3 and D4, being connected in series with the capacitors C6 and C5, respectively, form a short circuit for the comparatively high RF currents generated in the active state of the transmitter coil, so that the varicaps DCT and DCM are actually short-circuited. In the active state of the detection coil, these diodes D1 and D2, D3 and D4 and the capacitors C5, C6 will not form a short circuit in view of the small signals detected by the detection coil L. The diodes are connected in series with a capacitor C5, C6 in order to block the DC voltages to be applied to the matching diode DCM and the tuning diode DCT. The circuit shown in FIG. 3 also ensures that RF pulses generated in the active state of the transmitter coil themselves generate a blocking voltage for the PIN diodes P1-P6. In the first instance the +300V control voltage applied to the PIN diode P7 deactivates the resonant circuit. The PIN diodes P1 and P3 are then bridged by resistors R4 and R5, respectively. The resistors R4 and R5 ensure that a blocking voltage is always presented to the PIN diode P2, so that the PIN diode remains blocked. When the voltages generated in the detection coil L are higher than the control voltage applied to the anode of the PIN diode P7 due to the fact that the transmitter coil 12 is activated, the RF voltages generated in the detection coil L will charge the capacitor C3, so that the PIN diode P2 still remains blocked. The PIN diode P7 serves to ensure that any voltage generated by the RF pulses, and impressed on the cathode of the PIN diode P3 is retained. When the detection circuit shown in FIG. 3 is to be activated again, the junction of the cathodes of the PIN diodes P7 and P3 is connected to a negative voltage E− via a transistor 30 whose gate electrode receives a control voltage V, so that the PIN diodes P1 to P3 become conductive and the circuit comprising the coil L and the capacitors C1 to C3 can form a resonant circuit. Via the resistor R1, the PIN diode P6 will also be conductive so that the small voltages generated upon reception of RF signals by the detection coil L can be applied to the detector 14 which is connected to the anode of the PIN diode P6 via a lead.

What is claimed is:

1. A circuit for use in a magnetic resonance imaging apparatus that includes a detection coil for detecting spin resonance signals in an object under examination, said circuit comprising: a series connection of at least one capacitor and a first pin diode switch coupled to terminals for connection to the detection coil thereby to form a resonant circuit that includes the capacitor, the first pin diode switch and the detection coil, a second pin diode switch in a connection lead that couples the resonant circuit to a further circuit for processing spin resonance signals detected by a connected detection coil, and means for biasing said first and second pin diode switches so that, in operation of a magnetic resonance imaging apparatus, when an RF transmitter coil of the magnetic resonance imaging apparatus is active the first pin diode switch interrupts the resonant circuit and the second pin diode switch interrupts said connection lead to block signal flow from the resonant circuit to said signal processing circuit.

2. A circuit as claimed in claim 1 further comprising a varicap diode coupled to the resonant circuit so as to adjust the resonant frequency thereof, and a third pin diode switch coupling the varicap diode to a source of control voltage for tuning the frequency of the resonant circuit via said varicap diode.

3. A circuit as claimed in claim 2 further comprising a second varicap diode in said connection lead in series with the second pin diode switch, and a fourth pin diode switch coupling the second varicap diode to a source of control voltage that adjusts the capacitance of the second varicap diode so as to match the impedance of the resonant circuit to an input impedance of the signal processing circuit.

4. A circuit as claimed in claim 3 wherein said biasing means comprises a fifth pin diode switch for coupling a further control voltage to the resonant circuit so as to activate the first and third pin diode switches when the RF transmitter coil is deactivated and vice versa.

5. A circuit as claimed in claim 4 wherein said biasing means further comprises a sixth pin diode switch connected in a series circuit with the first and fifth pin diode switches between terminals of said further control voltage.

6. A circuit as claimed in claim 1 further comprising a varicap diode in said connection lead in series with the second pin diode switch, and a third pin diode switch coupling the varicap diode to a source of control voltage that adjusts the capacitance of the varicap diode so as to match the impedance of the resonant circuit to an input impedance of the signal processing circuit.

7. A circuit as claimed in claim 2 wherein said second and third pin diode switches are connected in circuit with a polarity such that an induced voltage generated in the detection coil in the active state of the RF transmitter coil is rectified by said second and third pin diode switches with a polarity to form a blocking voltage for the second and third pin diode switches so as to increase a blocking bias voltage at said second and third pin diode switches thereby to better block any RF current flow therethrough.

8. A magnetic resonance imaging apparatus comprising, a magnet system for generating a steady uniform main magnetic field and gradient magnetic fields, a transmitter coil for generating a local uniform RF magnetic alternating field in an examination space, a detection coil for detecting spin resonance signals generated in an object to be examined, a series connection of at least one capacitor and a first pin diode switch coupled to the detection coil thereby to form a resonant circuit that includes the capacitor, the first pin diode switch and the detection coil, a second pin diode switch in a connection lead that couples the resonant circuit to a further circuit for processing spin resonance signals detected by the detection coil, and means for biasing said first and second pin diode switches so that when the RF transmitter coil is active the first pin diode switch interrupts the resonant circuit and the second pin diode switch interrupts said connection lead to block signal flow from the resonant circuit to said signal processing circuit.

9. An apparatus as claimed in claim 8 further comprising a varicap diode coupled to the resonant circuit so as to adjust the resonant frequency thereof, and a third pin diode switch coupling the varicap diode to a source of control voltage for tuning the frequency of the resonant circuit via said varicap diode.

10. An apparatus as claimed in claim 9 further comprising a second varicap diode in said connection lead in series with the second pin diode switch, and means for selectively applying a control voltage to the second varicap diode thereby to adjust the capacitance of the second varicap diode so as to match the impedance of the resonant circuit to an input impedance of the signal processing circuit.

* * * * *